(12) United States Patent
Chen et al.

(10) Patent No.: US 10,937,481 B1
(45) Date of Patent: Mar. 2, 2021

(54) POLARITY SWAPPING CIRCUITRY

(71) Applicant: Arm Limited, Cambridge (GB)

(72) Inventors: Andy Wangkun Chen, Austin, TX (US); Peixuan Tan, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/534,942

(22) Filed: Aug. 7, 2019

(51) Int. Cl.
*G11C 5/06* (2006.01)
*G11C 7/18* (2006.01)
*G11C 7/10* (2006.01)
*G11C 11/16* (2006.01)
*G11C 11/419* (2006.01)
*G11C 11/418* (2006.01)

(52) U.S. Cl.
CPC ............ *G11C 11/1655* (2013.01); *G11C 5/06* (2013.01); *G11C 7/1006* (2013.01); *G11C 7/18* (2013.01); *G11C 11/1675* (2013.01); *G11C 11/418* (2013.01); *G11C 11/419* (2013.01)

(58) Field of Classification Search
CPC ............ G11C 5/06; G11C 7/1006; G11C 7/18
USPC ................. 365/63, 189.15, 189.17
See application file for complete search history.

(56) References Cited

U.S. PATENT DOCUMENTS

| | | | | |
|---|---|---|---|---|
| 7,136,308 B2* | 11/2006 | Kant | ............... | G11C 7/10 365/189.16 |
| 7,203,100 B2* | 4/2007 | Kant | ............... | G06F 9/3851 365/185.14 |
| 7,639,546 B2* | 12/2009 | Kikuchi | ............... | G11C 7/1006 365/185.08 |
| 7,804,730 B2* | 9/2010 | Redgrave | ............... | G11C 7/06 365/154 |
| 8,116,114 B2* | 2/2012 | Kobayashi | ............... | G11C 29/48 365/190 |
| 8,644,083 B2* | 2/2014 | Noorlag | ............... | G11C 7/04 365/189.011 |
| 2008/0205178 A1* | 8/2008 | Chung | ............... | G11C 11/4097 365/205 |

* cited by examiner

*Primary Examiner* — Son L Mai
(74) *Attorney, Agent, or Firm* — Pramudji Law Group PLLC; Ari Pramudji

(57) ABSTRACT

Various implementations described herein are directed to a device having memory circuitry having bitcells coupled together via bitlines. The device may include polarity swapping circuitry having multiple conductive paths that are configured to couple the bitlines together. In some instances, first paths of the multiple conductive paths couple the bitlines together via first passgates, and second paths of the multiple conductive paths couple the bitlines together via second passgates.

20 Claims, 5 Drawing Sheets

POLARITY SWAPPING CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, aging effect and endurance are important issues for performance of static random access memory (SRAM) and magneto-resistive random access memory (MRAM). For SRAM, if an SRAM bitcell stores the same value for a long duration, its performance can degrade, and an excessively long duration can lead to even more degradation, which refers to the aging effect for SRAM. For MRAM, specific physical properties can require higher write current to write logic 1 into an MRAM bitcell. This high current can degrade endurance of the MRAM bitcell. In reference to logic state transition between 0 and 1 for the MRAM bitcell, when writing logic 1 into the MRAM bitcell, voltage is higher, and resistance of the MRAM bitcell is low. Thus, the current is much higher for writing logic 1 to the MRAM bitcell when compared to writing logic 0. As such, there exists a need to improve physical design implementation of SRAM and MRAM circuitry.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
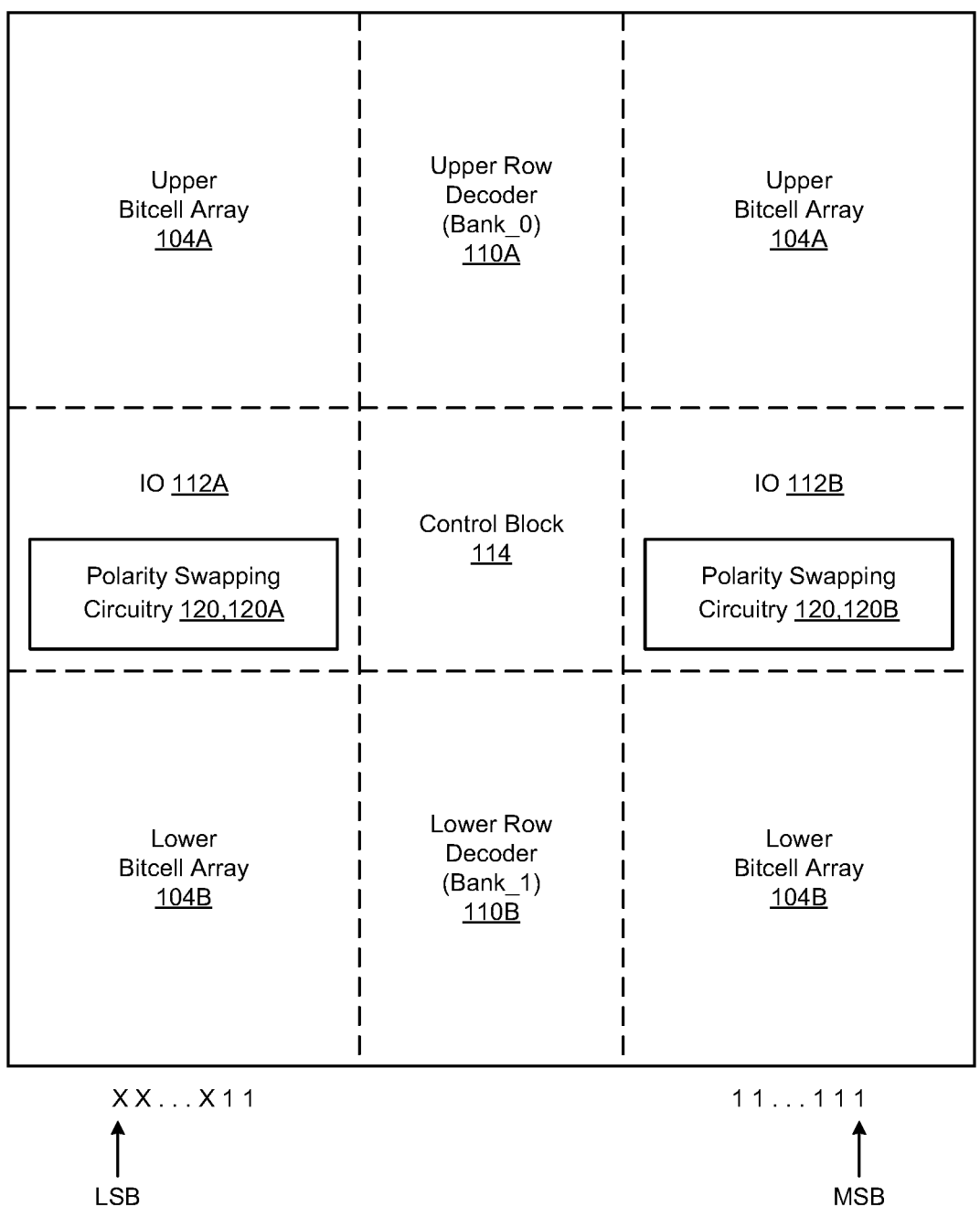
FIG. 1 illustrates a diagram of memory circuitry having polarity swapping circuitry in accordance with various implementations described herein.

Various implementations described herein are directed to memory architecture and/or circuitry for implementing polarity swapping methodologies to improve aging and/or endurance of memory cells. Various schemes and techniques described herein provide for improved architectural design of memory circuitry to improve the aging effect of static random access memory (SRAM) and the endurance of magneto-resistive random access memory (MRAM). In some implementations, the memory architecture described herein provides for a multi-bank memory architecture having different polarities within each bank (i.e., bank_0, bank_1) and a single bit bank address to select which polarity to use.

For instance, SRAM memory may be designed for polarity swapping by reading and/or writing positive polarity to bank_0, wherein logic state 0 refers to bitline (BL)=Vss and nbitline (NBL)=Vdd. The SRAM memory may also be designed for polarity swapping by reading and/or writing negative polarity to bank_1, wherein logic state 1 refers to bitline (BL)=Vss and nbitline (NBL)=Vdd. With this memory architecture, the same input data may be stored in a positive polarity bank (e.g., bank_0) or a negative polarity bank (e.g., bank_1) with the bank address toggling, so that a controller (e.g., CPU) may dynamically toggle the bank address to swap the polarity when in power down mode or at anytime that the SRAM logic state may be lost. Thus, with many logic zeros (0s) and ones (1s) stored in SRAM memory, the SRAM bitcell may switch logic state more frequently to thereby improve the aging effect of the SRAM bitcell.

In other instances, MRAM memory may be designed for polarity swapping by reading and/or writing positive polarity to bank_0, which refers to a parallel state that represents logic state 0, and an anti-parallel state that represents logic state 1 in a high current state. Also, the MRAM memory may be designed for polarity swapping by reading and/or writing negative polarity to bank_1, which refers to logic state 1 being stored in the parallel state, and logic state 0 being stored in the anti-parallel state. With this memory architecture, small positive data having many logic zeros (0s) may be written to bank_0, and small negative data having many logic ones (1s) may be written into bank_1. In this instance, the controller may detect a first bit of data (e.g., sign bit) to decide which bank to store the data to and then toggle the bank address accordingly. Based on the machine learning (ML) data characterization, the LSB (least significant bit) of the input data may vary between 0 and 1, and to compensate for this situation, the controller may reverse the input data order of the LSB and the MSB (most significant bit), e.g., from Data[MSB:LSB] to Data[LSB:MSB]. Thusly, the frequency of writing logic 1 may be reduced significantly and the endurance of the MRAM bitcell may be maintained at a high level.

Various implementations of polarity swapping schemes and techniques will now be described in detail herein with reference to FIGS. 1-3.

FIG. 1 illustrates a diagram of memory circuitry 100 having polarity swapping circuitry 120 in accordance with implementations described herein. In some instances, the memory circuitry 100 may be implemented as a system or device having various circuit components that are arranged and coupled together as an assemblage or combination of parts that provide for a physical circuit design and related structures. Also, in some other instances, a method of designing, providing and building the memory circuitry 100 may involve use of the various circuit components described herein so as to thereby implement polarity swapping schemes and techniques associated therewith.

As shown in FIG. 1, the memory circuitry 100 includes various components including, e.g., core array circuitry 104A, 104B, row decoder circuitry 110A, 110B, column decoder circuitry 112A, 112B and control block circuitry 114. In some instances, the core array circuitry 104A, 104B may include upper bitcell arrays 104A and lower bitcell arrays 104B. The row decoder circuitry 110A, 110B may include an upper row decoder 110A coupled between the upper bitcell arrays 104A, and the row decoder circuitry 110A, 110B may include lower row decoder 110B coupled between the lower bitcell arrays 104B. The column decoder circuitry 112A, 112B may include first input-output (IO) circuitry 112A coupled between upper/lower bitcell arrays 104A, 104B, and the column decoder circuitry 112A, 112B may include second IO circuitry 112B coupled between upper/lower bitcell arrays 104A, 104B. The first IO circuitry 112A may include the polarity swapping circuitry 120, such as, e.g., first polarity swapping circuitry 120A, and the second IO circuitry 112B may include the polarity swapping circuitry 120, such as, e.g., second polarity swapping circuitry 120B. The control block circuitry 114 may be coupled between the first/second row decoders 110A, 110B, and the control block circuitry 114 may be coupled between the first/second IO circuitry 112A, 112B. Also, further description related to the memory circuitry 100 and various components associated therewith, such as, e.g., the swapping circuitry 120, are described in greater detail herein below.

In some instances, the memory circuitry 100 provides for dynamic swapping of the LSB bits (least significant bits) and the MSB bits (most significant bits). Endurance may not be improved for the LSB bits, because the LSB bits may still be logic 0 or logic 1 for small input numbers. However, the endurance may be improved by re-ordering and/or swapping the LSB/MSB bits. To reverse order of Data[MSB:LSB] to Data[LSB:MSB], the original data order may be changed or modified by switching the LSB bit and the MSB bit, and also, the LSB+1 bit and the MSB−1 bit. In some instances, an extra column redundant bit for the LSB bit may be used to compensate for uncertainty of polarity. Another scheme and technique may be used to add inversion on the LSB bits, and in this instance, the flag bit may be used to remember the inversion.

In some instances, the memory circuitry 100 may provide a sequential access address counter. For instance, in reference to ML applications, memory may be accessed sequentially. For instance, the input data may be stored in RAM until memory is full, the data may be read from RAM until all computation is completed, and as such, the RAM may be accessed sequentially. This technique may be achieved with a method to decide writing to bank_0 or bank_1. For instance, the method may reset a counter for bank_0 and/or bank_1, and when writing data into memory, there is a comparison on the input data to decide whether the input data is a small positive or small negative. Based on the decision, the input data may be written into bank_0 or bank_1, accordingly. Then, the counter for bank_0 and/or bank_1 may be compared to the fullness of the memory. If the counter is not full, then the input data may be written into an expected bank, and if the counter is full, then the data may be written into the other bank (e.g., opposite bank).

The memory circuitry 100 may be implemented as an integrated circuit (IC) in using various types of memory, such as, e.g., random access memory (RAM), including static RAM (SRAM), magneto-resistive RAM (MRAM), and/or any other type of similar memory. The memory circuitry 100 may be implemented as an IC with dual rail memory architecture and related circuitry. The memory circuitry 100 may also be integrated with computing circuitry and related components on a single chip. Also, the memory circuitry 100 may be implemented in various embedded systems for various electronic, mobile and Internet-of-things (IoT) applications, including low power sensor nodes.

As shown in FIG. 1, the memory circuitry 100 includes the core array circuitry (CORE) 104A, 104B that has an array of memory cells, wherein each memory cell may be referred to as a bitcell. Also, each memory cell may be configured to store at least one data bit value (e.g., a data value related to a logical '0' or '1'). The array of memory cells may include any number (N) of memory cells (or bitcells) arranged in various applicable configurations, such as, e.g., a two-dimensional (2D) memory array having any number of columns (Ncolumns) and any number of rows (Nrows) with memory cells arranged in a 2D grid pattern with associated indexing capabilities.

Figure 2:
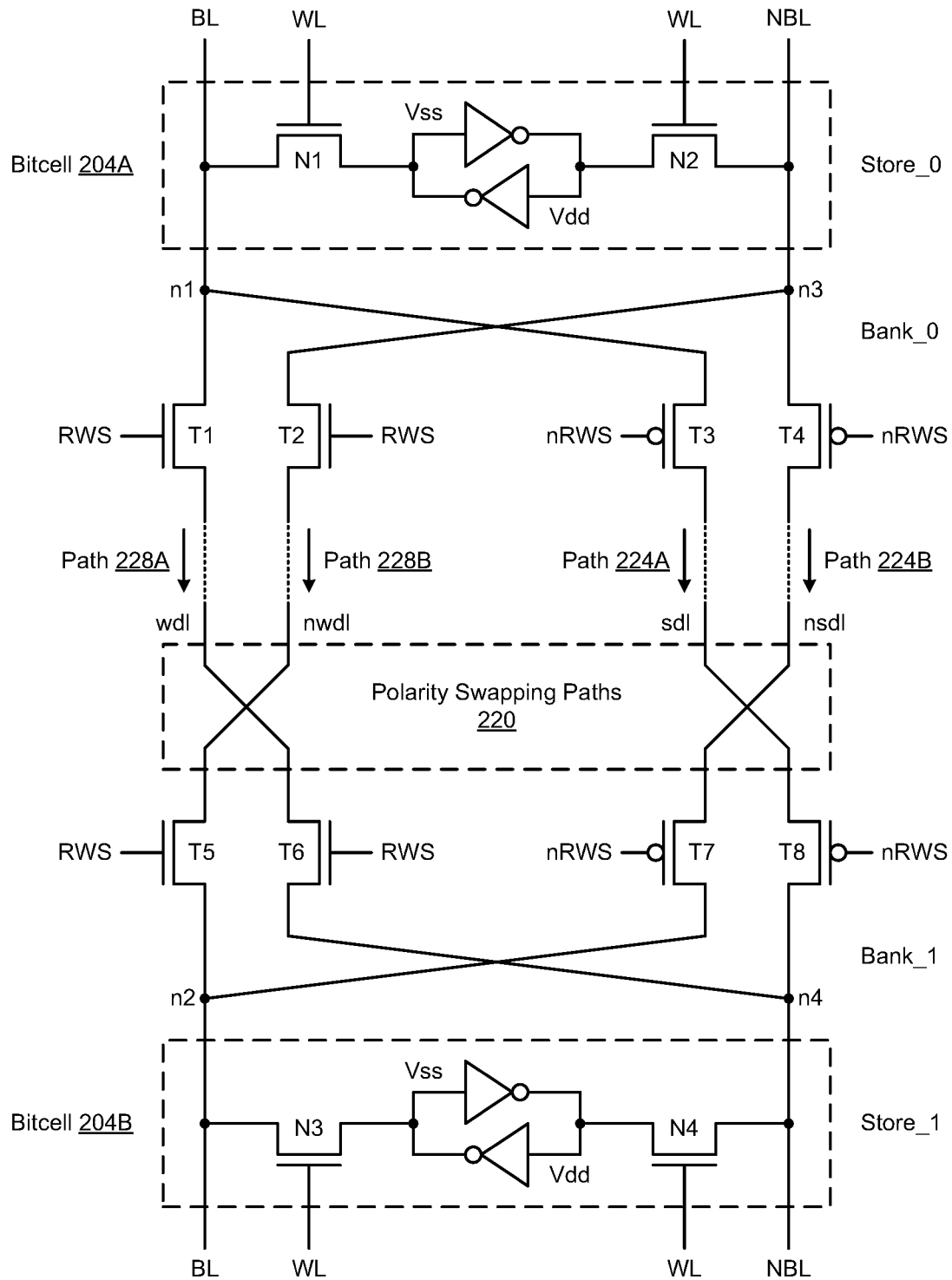
FIG. 2 illustrates a diagram of polarity swapping circuitry in accordance with various implementations described herein.

FIG. 2 illustrates a diagram of polarity swapping circuitry 120S in accordance with various implementations described herein. In some instances, the polarity swapping circuitry 120S may be implemented as the polarity swapping circuitry 120, 120A, 120B in the memory circuitry 102 of FIG. 1. Also, as shown, the polarity swapping circuitry 120S may be implemented with SRAM architecture.

In some instances, the polarity swapping circuitry 120S may be implemented as a system or device having various circuit components arranged and coupled together as an assemblage or combination of parts that provide for physical circuit design and related structures. Also, a method of designing, providing and/or building the polarity swapping circuitry 120S may involve use of various circuit components described herein so as to implement polarity swapping schemes and techniques associated therewith.

As shown in FIG. 2, the polarity swapping circuitry 120S may include memory circuitry having bitcells 204A, 204B coupled together via bitlines (BL, NBL). The bitcells 204A, 204B may include a first bitcell 204A for storing a first logic state of zero (0), and the bitcells 204A, 204B may include a second bitcell 204B for storing a second logic state of one (1). The bitcells 204A, 204B may be implemented with SRAM bitcells, such as, e.g., 6T SRAM bitcells. For instance, the first bitcell 204A may include multiple inverters and data access transistors (N1, N2) having a wordline (WL) coupled to gates thereof, and the second bitcell 204B may include multiple inverters and data access transistors (N3, N4) having the wordline (WL) coupled to gates thereof. Also, the multiple bitlines (BL, NBL) may include a first bitline (BL) and a second bitline (NBL) that is a complement of the first bitline (BL), and the first bitcell 204A and a second bitcell 204B may be coupled together via the first bitline (BL) and the second bitline (NBL).

The polarity swapping circuitry 120S may include polarity swapping paths 220 as multiple conductive paths that are configured to couple the bitlines (BL, NBL) together, e.g., in a cross-coupled manner. As such, in some instances, the polarity swapping paths 220 may be used for swapping polarity of the bitlines (BL, NBL) with multiple conductive paths that are configured to couple the bitlines (BL, NBL) together. The polarity swapping paths 220 may include first paths 224A, 224B of the multiple conductive paths that are used to couple the bitlines (BL, NBL) together via first passgates (T3/T8, T4/T7). Also, the polarity swapping paths 220 may include second paths 228A, 228B of the multiple conductive paths that are used to couple the bitlines (BL, NBL) together via second passgates (T1/T6, T2/T5). In some instances, the first paths 224A, 224B and the second paths 228A, 228B may be configured to cross-couple the bitlines (BL, NBL) together in a manner as shown in FIG. 2.

In some instances, the first paths 224A, 224B may include a first sense data line (sdl) 224A and a second sense data line (nsdl) 224B that couple the first bitline (BL) to the second bitline (NBL). Also, in some instances, the second paths 228A, 228B may include a first word data line (wdl) 228A and a second word data line (nwdl) 228B that couple the second bitline (NBL) to the first bitline (BL). The passgates (T1, T2, T3, T4) may be coupled between the first bitcell 204A and the polarity swapping paths 220, and the passgates (T5, T6, T7, T8) may be coupled between the second bitcell 204B and the polarity swapping paths 220. The first sense data line path (sdl) and the second word data line path (nsdl) couple the first bitline (BL) to the second bitline (NBL) via the first passgates (T3/T8, T4/T7), and also, the first word data line path (wdl) and the second sense data line path (nwdl) couple the second bitline (NBL) to the first bitline (BL) via the second passgates (T1/T6, T2/T5).

In some implementations, the second bitline (NBL) is a complement to the first bitline (BL), the second word data line (nwdl) is a complement to the first word data line (wdl), and also, the second sense data line (nsdl) is a complement to the a first sense data line (sdl). Also, the first passgates (T3/T8, T4/T7) and the second passgates (T1/T6, T2/T5) are complementary metal-oxide-semiconductor (CMOS) based transistors that are enabled with read-write selection signals (RWS, nRWS) coupled to gates thereof. Also, in some cases, the first passgates (T3/T8, T4/T7) may be implemented with p-type MOS (PMOS) transistors, and the second passgates (T1/T6, T2/T5) may be implemented with n-type MOS (NMOS) transistors. In other cases, the first passgates (T3/T8, T4/T7) may be implemented with NMOS transistors, and the second passgates (T1/T6, T2/T5) may be implemented with PMOS transistors.

In some implementations, as shown in FIG. 2, the first bitline (BL) may be coupled to the second bitline (NBL) via nodes (n1, n4), wherein passgates (T1, T6) may be coupled between nodes (n1, n4) along word data line (wdl), and passgates (T3, T8) may be coupled between nodes (n1, n4) along source data line (sdl). Also, as shown in FIG. 2, the second bitline (NBL) may be coupled to the first bitline (BL) via nodes (n3, n2), wherein passgates (T2, T5) may be coupled between nodes (n3, n2) along complementary word data line (nwdl), and passgates (T4, T7) may be coupled between nodes (n3, n2) along complementary source data line (nsdl). As such, the complementary word data lines (wdl, nwdl) are cross-coupled, and the complementary source data lines (sdl, nsdl) are also cross-coupled.

In various instances, each memory cell 204A, 204B may be implemented with RAM circuitry, or some other type of volatile type memory. For instance, each memory cell 204A, 204B may include a multi-transistor static RAM (SRAM) cell, such as, e.g., the 6T CMOS SRAM (as shown in FIG. 2) and/or various other types of complementary MOS (CMOS) SRAM cells, such as, e.g., 2T, 4T, 8T, or more transistors per bit. Also, the RAM circuitry may operate at various source voltage levels (e.g., Vdd, Vss, etc.) with a voltage range that varies with applicable technology for specific ICs.

Figure 3:
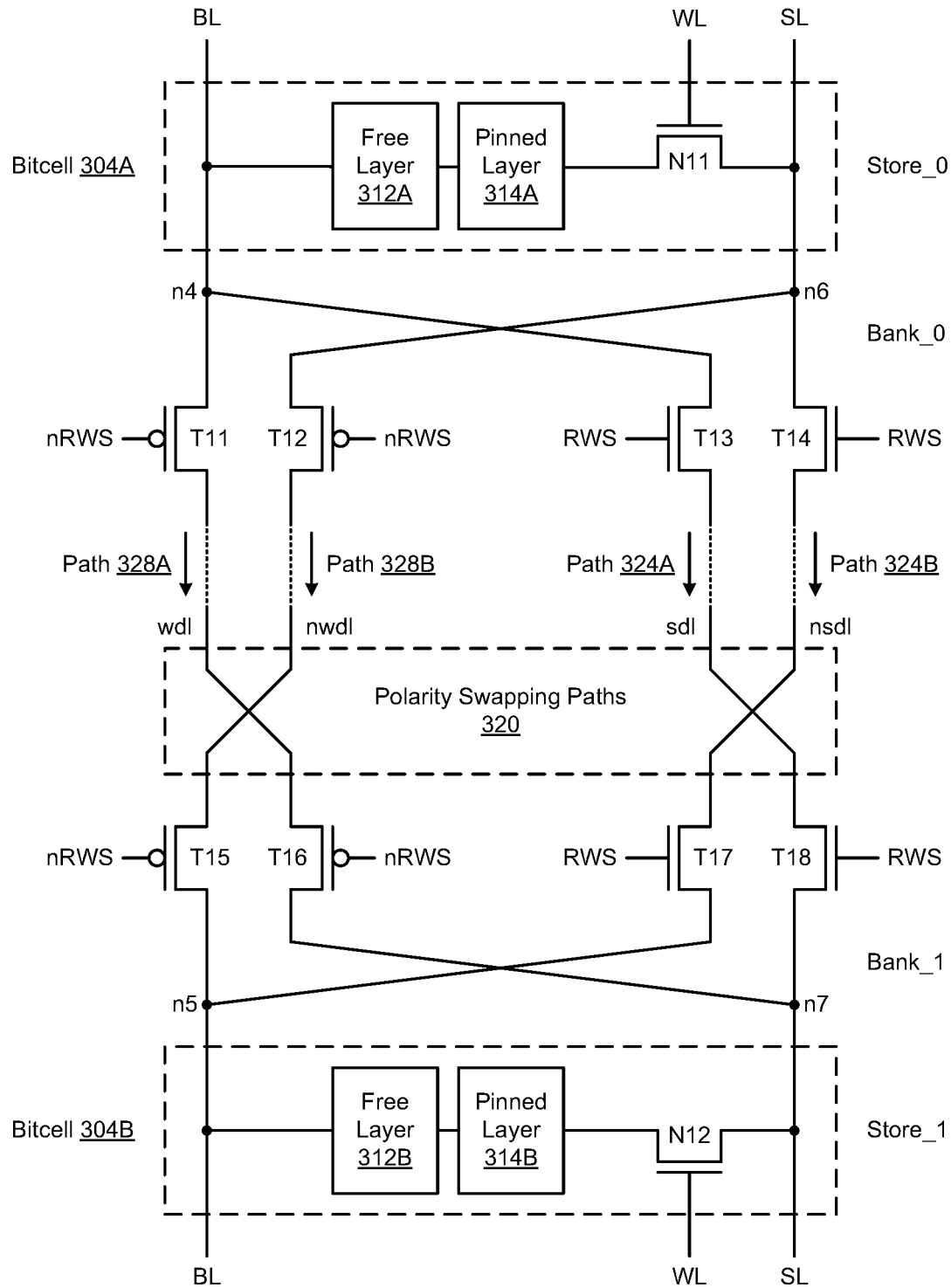
FIG. 3 illustrates another diagram of polarity swapping circuitry in accordance with various implementations described herein.

FIG. 3 illustrates a diagram of polarity swapping circuitry 120M in accordance with implementations described herein. In some instances, the polarity swapping circuitry 120M may be implemented as the polarity swapping circuitry 120, 120A, 120B in the memory circuitry 102 of FIG. 1. Also, as shown, the polarity swapping circuitry 120M may be implemented with MRAM architecture.

In some instances, the polarity swapping circuitry 120M may be implemented as a system or device having various circuit components arranged and coupled together as an assemblage or combination of parts that provide for physical circuit design and related structures. Also, a method of designing, providing and/or building the polarity swapping circuitry 120M may involve use of various circuit components described herein so as to implement polarity swapping schemes and techniques associated therewith.

As shown in FIG. 3, the polarity swapping circuitry 120M may include memory circuitry having a first bitcell 304A and a second bitcell 304B coupled together via a first bitline (BL) and a source line (SL). The first bitcell 304A may be configured for storing a first logic state of zero (0), and the second bitcell 304B may be configured for storing a second logic state of one (1). The bitcells 304A, 304B may be implemented with MRAM bitcells having free layers 312A, 312B and pinned layers 314A, 314B, respectively. For instance, the first bitcell 304A may include a first free layer 312A, a first pinned layer 314A and a first data access transistor (N11) having a wordline (WL) coupled to a gate thereof, and the second bitcell 304B may include a second free layer 312B, a second pinned layer 314B and a second data access transistor (N12) having the wordline (WL) coupled to a gate thereof. In some instances, the multiple bitlines (BL, NBL) may include a first bitline (BL) and a source line (SL) that is a complement of the first bitline (BL), and also, the first bitcell 304A and a second bitcell 304B may be coupled together via the first bitline (BL) and the source line (SL).

The polarity swapping circuitry 120M may include polarity swapping paths 320 as conductive paths including a first word data line (wdl) path 328A, a second word data line (nwdl) path 328B, a first sense data line (sdl) path 324A, and a second sense data line (nsdl) 324B. As such, in some instances, the polarity swapping paths 320 may be used for swapping polarity of the bitline (BL) and source line (SL) with multiple conductive paths that are configured to couple the bitline (BL) and source line (SL) together.

The polarity swapping circuitry 120M may include write passgate circuitry having multiple passgates (T11, T12, T13, T14, T15, T16, T17, T18) including passgates (T11, T12, T13, T14) coupled between the first bitcell 304A and the polarity swapping paths 320 and passgates (T15, T16, T17, T18) coupled between the second bitcell 304B and the polarity swapping circuitry 320. The first sense data line path (sdl) 324A and the second word data line path (nwdl) 328A are used to couple the first bitline (BL) to the source line (SL) via first passgates (T13/T18, T14/T17). The first word data line path (wdl) 328A and the second sense data line path (nsdl) 324B may be used to couple the source line (SL) to the first bitline (BL) via second passgates (T11/T16, T12/T15). In some instances, the conductive paths 320 may be used to cross-couple the first bitline (BL) and the source line (SL) together. Also, in some instances, the second word data line (nwdl) may be a complement to the first word data line (wdl), and the second sense data line (nsdl) may be a complement to the first sense data line (sdl).

In various instances, each memory cell 304A, 304B may be implemented with RAM circuitry, or some other type of memory. For instance, each memory cell (or bitcell) 304A, 304B may include a multi-layer MRAM cell per bit. Also, the MRAM circuitry may operate at various source voltage levels (e.g., Vdd, Vss, etc.) with a voltage range that varies with applicable technology for specific integrated circuits (ICs).

Figure 4:
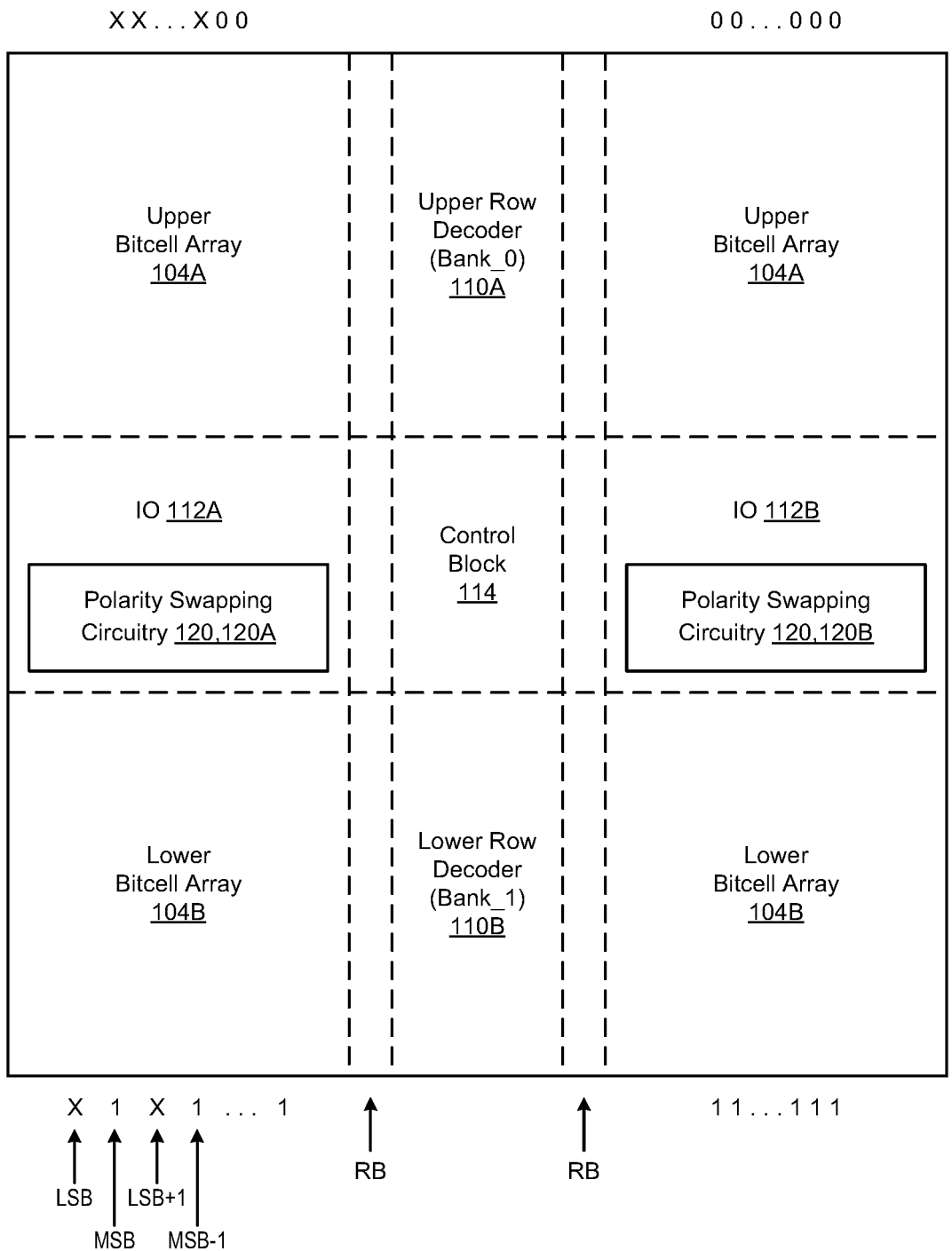
FIG. 4 illustrates a diagram of memory circuitry with redundancy for dynamic bit swapping in accordance with various implementations described herein.

FIG. 4 illustrates a diagram of the memory circuitry 400 with redundancy for dynamic bit swapping in accordance with implementations described herein. The memory circuitry 100 of FIG. 4 is similar to the memory circuitry 100 of FIG. 1, wherein similar components have similar scope, function and operation. Also, the bitcell arrays 104A, 104B may be implemented with SRAM or MRAM architecture, and the polarity swapping circuitry 120, 120A, 120B may be implemented as described herein.

As described herein, the bitcell arrays 104A, 104B have a number of bitcells representing bits that are arranged in columns and rows, wherein each row of bitcells may refer to a number of bits including one or more least significant bits (e.g., LSB, LSB+1, etc.) and one or more most significant bits (e.g., MSB, MSB−1, etc.). In some instances, the polarity swapping circuitry 120, 120A, 120B may be configured to dynamically swap the one or more LSB bits (e.g., LSB, LSB+1, etc.) with the one or more MSB bits (e.g., MSB, MSB−1, etc.) so as to thereby improve endurance of the memory circuitry. Also, the bitcells may include a redundant bitcell representing a redundant bit (RB) in each row for tracking the swapping of the one or more LSB bits (e.g., LSB, LSB+1, etc.) with the one or more MSB bits (e.g., MSB, MSB−1, etc.). This operational feature may be referred to as dynamic swapping of LSB bits and MSB bits.

In some implementations, endurance of the memory circuitry may be improved by re-ordering and swapping of the LSB bits and MSB bits. For instance, to reverse order from data[MSB:LSB] to data[LSB:MSB], the original data order may be changed as shown in FIG. 4, wherein when switching the LSB and MSB bits, LSB+1 and MSB−1 bits, there may be a minimum penalty on wiring. Also, as shown, the bitcell arrays 104A, 104B may have an extra column of redundant bits (RB) for LSB to compensate for uncertainty of the polarity. Also, in other instances, this technique may include adding inversion on LSB bits, wherein a flag bit may be used to remember the inversion.

Figure 5:
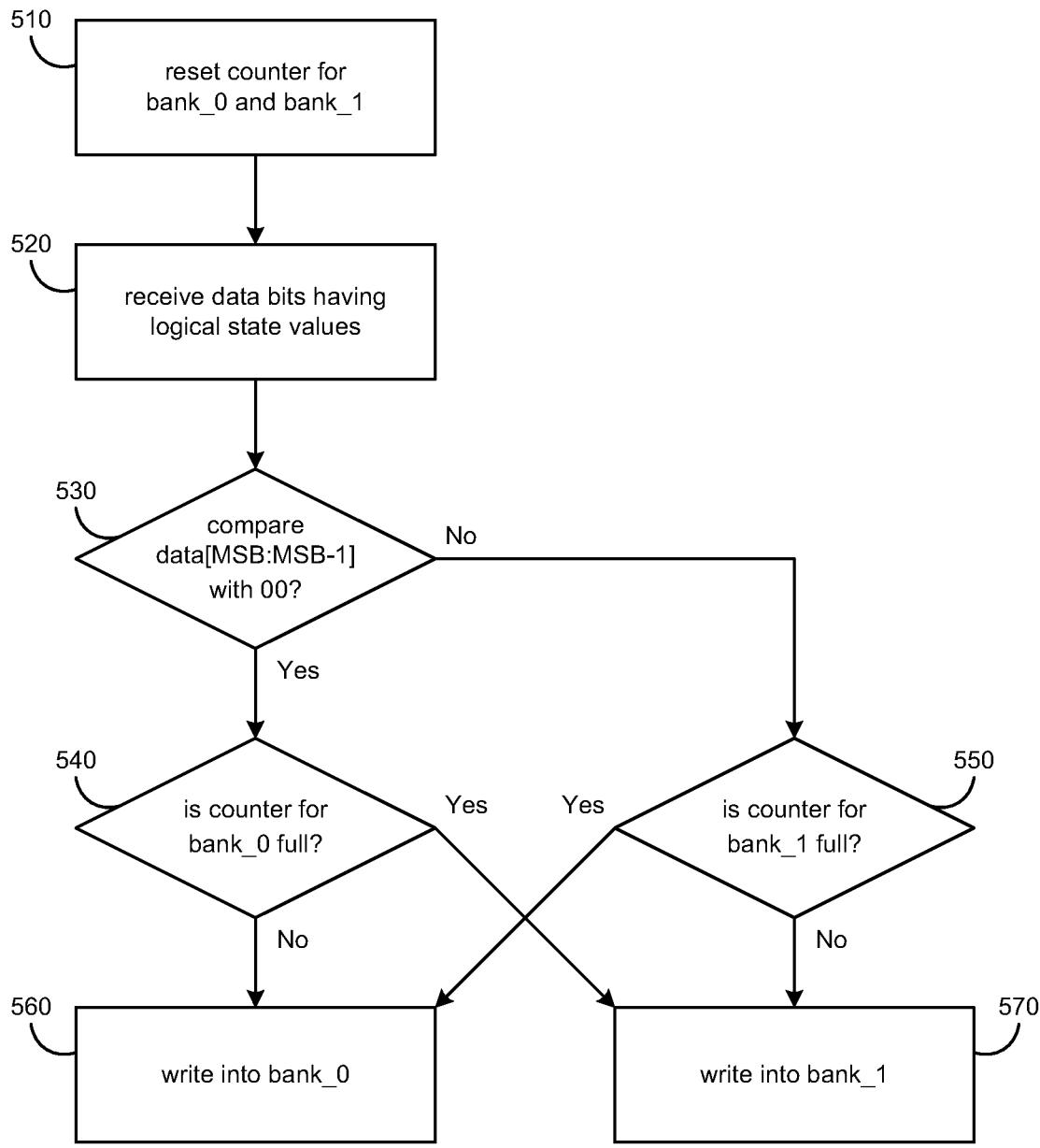
FIG. 5 illustrates a process flow diagram of a method for sequential access address counting in accordance with various implementations described herein.

FIG. 5 illustrates a process diagram of a method 500 for sequential access address counting in accordance with various implementations described herein.

It should be understood that even though method 500 may indicate a particular order of execution of operations, in some instances, certain portions of operations may be executed in a different order, and on different systems. In other instances, additional operations or steps may be added to and/or omitted from method 500. Also, a computing device may be configured to perform method 500. As such, in some instances, method 500 may be implemented as a program or software instruction process that is configured to provide various schemes and techniques as described herein.

At block 510, method 500 may reset a first counter for a first memory bank (e.g., bank_0) and reset a second counter for a second memory bank (e.g., bank_1). At block 520, method 500 may receive one or more data bits (e.g., 2 data bits) having a logical state value. At decision block 530, method 500 may compare the logical state value of the one or more data bits (e.g., 2 data bits: [MSB:MSB−1]) with a null state (e.g., 00). If the logical state value of the one or more data bits is equal to the null state, then increment the first counter (e.g., +1), and method 500 proceeds to block 540. Otherwise, if the logical state value of the one or more data bits is not equal to the null state, then increment the second counter (e.g., +1), and method 500 proceeds to block 550. At decision block 540, if the first counter for the first bank (e.g., bank_0) is less than full, then in block 560, write the logical state value of the one or more data bits into the first memory bank (e.g., bank_0). Otherwise, at block 540, if the first counter is full, then at block 570, write the logical state value of the one or more data bits into the second memory bank (e.g., bank_1). At decision block 550, if the second counter for the second bank (e.g., bank_1) is less than full, then in block 570, write the logical state value of the one or more data bits into the second memory bank (e.g., bank_1). Otherwise, at block 550, if the second counter is full, then at block 560, write the logical state value of the one or more data bits into the first memory bank (e.g., bank_0).

Described herein are various implementations of a device. The device may include memory circuitry having bitcells coupled together via bitlines. The device may include polarity swapping circuitry having multiple conductive paths that are configured to couple the bitlines together. In some instances, first paths of the multiple conductive paths couple the bitlines together via first passgates, and second paths of the multiple conductive paths couple the bitlines together via second passgates.

Described herein are various implementations of a system. The system may include memory circuitry having a first bitcell and a second bitcell coupled together via a first bitline and a second bitline. The system may include polarity swapping circuitry having conductive paths including a first word data line, a second word data line, a first sense data line, and a second sense data line. The system may include write passgate circuitry having first passgates coupled between the first bitcell and the polarity swapping circuitry and second passgates coupled between the second bitcell and the polarity swapping circuitry. The first sense data line path and the second word data line path couple the first bitline to the second bitline via the first passgates. The first word data line path and the second sense data line path couple the second bitline to the first bitline via the second passgates.

Described herein are various implementations of a method. The method may include providing memory circuitry with bitcells. The method may include coupling the bitcells together with bitlines. The method may include swapping polarity of the bitlines with multiple conductive paths that are configured to couple the bitlines together using multiple passgates.

Described herein are various implementations of a method. The method may include resetting multiple counters for multiple memory banks and receiving one or more data bits having logical state values. The method may include comparing the logical state values of the one or more data bits with predetermined data bit values. The method may include incrementing one or more of the multiple counters if the logical state value of the one or more data bits is equal to the predetermined data bit values. When one or more of the multiple counters are full, the method may include writing the logical state values of the one or more data bits into polarity swapped memory banks.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
memory circuitry having random access memory (RAM) bitcells coupled together via bitlines; and
polarity swapping circuitry having multiple conductive paths that are configured to couple the bitlines together between the RAM bitcells,
wherein first paths of the multiple conductive paths couple the bitlines together via first passgates, and
wherein second paths of the multiple conductive paths couple the bitlines together via second passgates.

2. The device of claim 1, wherein the first paths and the second paths cross-couple the bitlines together.

3. The device of claim 1, wherein:
the bitlines comprise a first bitline and a second bitline that is a complement of the first bitline, and
the RAM bitcells comprise a first RAM bitcell and a second RAM bitcell coupled together via the first bitline and the second bitline.

4. The device of claim 3, wherein:
the first paths comprise a first sense data line and a second sense data line that couple the first bitline to the second bitline, and
the second paths comprise a first word data line and a second word data line that couple the second bitline to the first bitline.

5. The device of claim 4, wherein:
the first passgates are coupled between the first RAM bitcell and the polarity swapping circuitry, and
the second passgates are coupled between the second RAM bitcell and the polarity swapping circuitry.

6. The device of claim 4, wherein:
the first sense data line path and the second word data line path couple the first bitline to the second bitline via the first passgates, and
the first word data line path and the second sense data line path couple the second bitline to the first bitline via the second passgates.

7. The device of claim 4, wherein:
the second bitline is a complement to the first bitline,
the second word data line is a complement to the first word data line, and
the second sense data line is a complement to the first sense data line.

8. A device, comprising:
memory circuitry having bitcells coupled together via bitlines; and
polarity swapping circuitry having multiple conductive paths that are configured to couple the bitlines together, wherein:
first paths of the multiple conductive paths couple the bitlines together via first passgates,
second paths of the multiple conductive paths couple the bitlines together via second passgates,
the bitcells refer to a number of bits including one or more least significant bits (LSB) and one or more most significant bits (MSB), and
the polarity swapping circuitry is configured for dynamically swapping the one or more LSB bits with the one or more MSB bits so as to thereby improve endurance of the memory circuitry.

9. The device of claim 1, wherein the RAM bitcells comprise at least one of static random access memory (SRAM) bitcells and magneto-resistive random access memory (MRAM) bitcells.

10. A system, comprising:
memory circuitry having a first random access memory (RAM) bitcell and a second RAM bitcell coupled together via a first bitline and a second bitline;
polarity swapping circuitry having conductive paths including a first word data line, a second word data line, a first sense data line, and a second sense data line; and
write passgate circuitry having first passgates coupled between the first RAM bitcell and the polarity swapping circuitry and second passgates coupled between the second RAM bitcell and the polarity swapping circuitry, wherein the first sense data line path and the second word data line path couple the first bitline to the second bitline via the first passgates, and wherein the first word data line path and the second sense data line path couple the second bitline to the first bitline via the second passgates.

11. The system of claim 10, wherein the conductive paths are used to cross-couple the first bitline and the second bitline together.

12. The system of claim 10, wherein:

the second bitline is a complement to the first bitline, the second word data line is a complement to the first word data line, and the second sense data line is a complement to the first sense data line.

13. The system of claim 10, wherein at least one of the first RAM bitcell and the second RAM bitcell comprise a magneto-resistive random access memory (MRAM) bitcell.

14. A method, comprising:

providing memory circuitry with random access memory (RAM) bitcells;

coupling the bitcells together with bitlines; and swapping polarity of the bitlines with multiple conductive paths that are configured to couple the bitlines together between the RAM bitcells using multiple passgates.

15. The method of claim 14, further comprising:

coupling the bitlines together with first paths of the multiple conductive paths via first passgates of the multiple passgates, and coupling the bitlines together with second paths of the multiple conductive paths via second passgates of the multiple passgates, wherein the multiple conductive paths are used to cross-couple the bitlines together.

16. The method of claim 14, wherein:

the bitlines comprise a first bitline and a second bitline that is a complement of the first bitline, the RAM bitcells comprise a first RAM bitcell and a second RAM bitcell coupled together via the first bitline and the second bitline, the first paths comprise a first sense data line and a second sense data line that is a complement of the first sense data line, and the second paths comprise a first word data line and a second word data line that is a complement of the first word data line.

17. A method, comprising:

resetting multiple counters for multiple memory banks;

receiving one or more data bits having logical state values;

comparing the logical state values of the one or more data bits with predetermined data bit values;

incrementing one or more of the multiple counters if the logical state value of the one or more data bits is equal to the predetermined data bit values; and when one or more of the multiple counters are full, writing the logical state values of the one or more data bits into polarity swapped memory banks.

18. The method of claim 17, wherein:

the multiple memory banks include a first memory bank having a first polarity and a second memory bank having a second polarity that is opposite the first memory bank, the multiple counters include a first counter for the first memory bank and a second counter for the second memory bank, and resetting the multiple counters for the multiple memory banks includes resetting the first counter for the first memory bank and resetting the second counter for the second memory bank.

19. The method of claim 18, wherein:

the predetermined data bit values refer to a null state, comparing the logical state values of the one or more data bits with the predetermined data bit values includes comparing the logical state values of the one or more data bits with the null state, if the logical state value of the one or more data bits is equal to the null state, then the method includes incrementing the first counter, and if the logical state value of the one or more data bits is not equal to the null state, then the method includes incrementing the second counter.

20. The method of claim 19, wherein:

when the one or more of the multiple counters are full, writing the logical state values of the one or more data bits into polarity swapped memory banks includes:

if the first counter is less than full, then the method includes writing the logical state value of the one or more data bits into the first memory bank; and if the first counter is full, then the method includes writing the logical state value of the one or more data bits into the second memory bank.

* * * * *